(12) United States Patent
Shinohara

(10) Patent No.: US 8,362,354 B2
(45) Date of Patent: Jan. 29, 2013

(54) PHOTOVOLTAIC APPARATUS AND METHOD OF MANUFACTURING THE SAME

(75) Inventor: Wataru Shinohara, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 888 days.

(21) Appl. No.: 12/169,374

(22) Filed: Jul. 8, 2008

(65) Prior Publication Data

US 2009/0014064 A1 Jan. 15, 2009

(30) Foreign Application Priority Data

Jul. 9, 2007 (JP) .................... 2007-179438

(51) Int. Cl.
*H01L 31/00* (2006.01)

(52) U.S. Cl. ........ 136/256; 136/244; 136/252; 136/258; 257/431; 257/448; 257/466

(58) Field of Classification Search .............. 136/248, 136/252, 256, 258; 257/431, 448, 466
See application file for complete search history.

(56) References Cited

U.S. PATENT DOCUMENTS

| | | | |
|---|---|---|---|
| 4,110,122 A | 8/1978 | Kaplow et al. | |
| 4,697,041 A | 9/1987 | Okaniwa et al. | |
| 6,080,928 A | 6/2000 | Nakagawa | |
| 6,437,231 B2 * | 8/2002 | Kurata et al. | 136/244 |
| 6,632,993 B2 * | 10/2003 | Hayashi et al. | 136/256 |
| 7,052,998 B2 | 5/2006 | Shinohara | |
| 7,235,736 B1 * | 6/2007 | Buller et al. | 136/251 |
| 2003/0172967 A1 | 9/2003 | Tachibana et al. | |
| 2007/0193619 A1 | 8/2007 | Shinohara | |

FOREIGN PATENT DOCUMENTS

| | | |
|---|---|---|
| EP | 1 258 925 A2 | 11/2002 |
| EP | 1 612 862 A2 | 1/2006 |
| JP | 61-214483 A | 9/1986 |
| JP | 9-82998 A | 3/1997 |
| JP | 2000-58886 A | 2/2000 |
| JP | 2001-274447 A | 10/2001 |
| JP | 2002-118273 A | 4/2002 |
| JP | 2002-261308 A | 9/2002 |
| JP | 2004-95661 A | 3/2004 |
| JP | 2004095661 A * | 3/2004 |

(Continued)

OTHER PUBLICATIONS

United States Office Action for co-pending U.S. Appl. No. 11/705,770, dated Oct. 15, 2009, pp. 1-10, US.

(Continued)

*Primary Examiner* — Jennifer Michener
*Assistant Examiner* — Matthew Martin
(74) *Attorney, Agent, or Firm* — Ditthavong Mori & Steiner, P.C.

(57) ABSTRACT

A photovoltaic apparatus includes a second groove so formed as to cut at least an intermediate layer, an insulating member so formed as to cover at least a cut portion of the intermediate layer in the second groove and extend along an upper surface of a second photoelectric conversion layer, and a third groove so formed as to pass through a first photoelectric conversion layer, the intermediate layer, the second photoelectric conversion layer and the insulating member on a region opposite to a first groove with respect to the second groove, wherein the insulating member is so formed as to extend up to at least a region opposite to the first groove with respect to the third groove.

11 Claims, 6 Drawing Sheets

FOREIGN PATENT DOCUMENTS

| | | |
|---|---|---|
| JP | 2005-38907 A | 2/2005 |
| JP | 2005-093939 A | 4/2005 |
| JP | 2005-101384 A | 4/2005 |
| JP | 2006-313872 A | 11/2006 |
| JP | 2007-227577 A | 9/2007 |

OTHER PUBLICATIONS

Extended European Search Report for corresponding EP Application No. 07250625.6-1235, dated Jan. 26, 2010, pp. 1-7.

Japanese Office Action for corresponding JP Patent Application No. 2007-179438, dated Jun. 30, 2009.

European Office Action for corresponding EP Application No. 08252322.6-1528/2023395, Aug. 12, 2011, pp. 1-5.

Japanese Office Action for corresponding JP Application No. 2006-046083, Jul. 19, 2011, pp. 1-5.

Chinese Office Action for corresponding CN Application No. 200710078823.6, May 22, 2009, China.

Japanese Office Action for corresponding JP Application No. 2006-046083, dated Sep. 21, 2010, pp. 1-6 Japan.

\* cited by examiner

PHOTOVOLTAIC APPARATUS AND METHOD OF MANUFACTURING THE SAME

CROSS-REFERENCE TO RELATED APPLICATIONS

The priority application number JP2007-179438, Photovoltaic Apparatus and Method of Manufacturing the Same, Jul. 9, 2007, Wataru Shinohara, upon which this patent application is based is hereby incorporated by reference.

BACKGROUND OF THE INVENTION

1. Field of the Invention

The present invention relates to a photovoltaic apparatus and a method of manufacturing the same, and more particularly, it relates to a photovoltaic apparatus comprising a conductive intermediate layer between a plurality of photoelectric conversion layers and a method of manufacturing the same.

2. Description of the Background Art

A photovoltaic apparatus comprising a conductive intermediate layer between a plurality of photoelectric conversion units (photoelectric conversion layers) is known in general, as disclosed in Japanese Patent Laying-Open No. 2002-118273, for example.

In the photovoltaic apparatus disclosed in the aforementioned Japanese Patent Laying-Open No. 2002-118273, first and second transparent electrodes are formed on a substrate at a prescribed interval, while a first photoelectric conversion unit is formed on the first and second transparent electrodes. A second photoelectric conversion unit is formed on the first photoelectric conversion unit through a conductive intermediate layer. First and second back electrodes are arranged on the second photoelectric conversion unit to correspond to the aforementioned first and second transparent electrodes respectively. The first back electrode is electrically connected to the second transparent electrode through a groove so formed as to pass through the second photoelectric conversion unit, the intermediate layer and the first photoelectric conversion unit.

In the photovoltaic apparatus disclosed in the aforementioned Japanese Patent Laying-Open No. 2002-118273, however, the first back electrode is in contact with the conductive intermediate layer in the groove, which disadvantageously results in an electrical short circuit between the first back electrode and the intermediate layer.

SUMMARY OF THE INVENTION

The present invention has been proposed in order to solve the aforementioned problem, and an object of the present invention is to provide a photovoltaic apparatus capable of suppressing an electrical short circuit between a back electrode and an intermediate layer also in the case of comprising the conductive intermediate layer between a plurality of photoelectric conversion layers and a method of manufacturing the same.

In order to attain the aforementioned object, a photovoltaic apparatus according to a first aspect of the present invention comprises a substrate having an insulating surface, a first substrate electrode and a second substrate electrode formed on the insulating surface of the substrate and separated through a first groove, a first photoelectric conversion layer so formed as to cover the first substrate electrode and the second substrate electrode, a second photoelectric conversion layer formed on a surface of the first photoelectric conversion layer through a conductive intermediate layer, a second groove so formed as to cut at least the intermediate layer on a region of the first substrate electrode, an insulating member so formed as to cover at least a cut portion of the intermediate layer in the second groove and extend along an upper surface of the second photoelectric conversion layer, a third groove so formed as to pass through the first photoelectric conversion layer, the intermediate layer, the second photoelectric conversion layer and the insulating member on a region opposite to the first groove with respect to the second groove and expose a surface of the first substrate electrode, a back electrode so formed as to electrically connecting the first substrate electrode and the second photoelectric conversion layer on a side of the second substrate electrode through the third groove and a fourth groove for electrically separating at least the back electrode into a first back electrode and a second back electrode corresponding to the first substrate electrode and the second substrate electrode respectively on a region opposite to the first groove with respect to the third groove, wherein the insulating member is so formed as to extend up to at least the region opposite to the first groove with respect to the third groove. "The insulating member is so formed as to extend" is a concept including the case of cutting the insulating member through the third groove or the fourth groove.

A method of manufacturing a photovoltaic apparatus according to a second aspect of the present invention comprises steps of forming a substrate electrode on an insulating surface of a substrate having the insulating surface, forming a first substrate electrode and a second substrate electrode separated through the first groove by forming a first groove on the substrate electrode, forming a first photoelectric conversion layer so as to cover the first substrate electrode and the second substrate electrode, forming a second photoelectric conversion layer on a surface of the first photoelectric conversion layer through a conductive intermediate layer, forming a second groove for cutting at least an intermediate layer on a region of the first substrate electrode, forming an insulating member so as to cover at least a cut portion of the intermediate layer in the second groove and extend along an upper surface of the second photoelectric conversion layer, forming a third groove on a region opposite to the first groove with respect to the second groove so as to pass through the first photoelectric conversion layer, the intermediate layer, the second photoelectric conversion layer and the insulating member and expose a surface of the first substrate electrode, forming a back electrode so as to electrically connect the first substrate electrode and the second photoelectric conversion layer on a side of the second substrate electrode through the third groove and forming a fourth groove for electrically separating at least the back electrode into a first back electrode and a second back electrode corresponding to the first substrate electrode and the second substrate electrode respectively on a region opposite to the first groove with respect to the third groove, wherein the step of forming the insulating member includes a step of forming the insulating member so as to extend up to at least the region opposite to the first groove with respect to the third groove.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of a photovoltaic apparatus 1 according to a first embodiment of the present invention will be now described with reference to FIG. 1.

Figure 1:
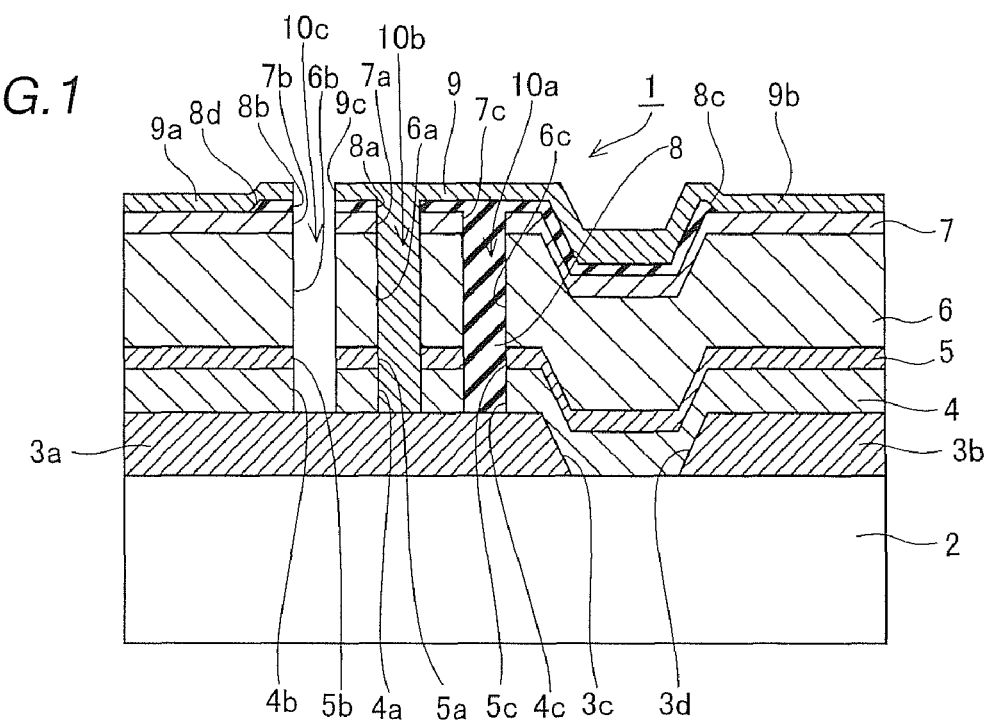
FIG. 1 is a sectional view showing a structure of a photovoltaic apparatus according to a first embodiment of the present invention.

As shown in FIG. 1, one unit of the photovoltaic apparatus 1 according to the first embodiment comprises a substrate 2, substrate electrodes 3a and 3b, a photoelectric conversion unit 4, an intermediate layer 5, another photoelectric conversion unit 6, a translucent conductive layer 7, an insulating member 8 and back electrodes 9a and 9b. This photovoltaic apparatus 1 according to the first embodiment is formed by serially connecting a plurality of units with each other in a direction along a main surface of the substrate 2 through the back electrodes 9a and 9b. The structure of the photovoltaic apparatus 1 will be hereinafter described in detail.

The substrate 2 has an insulating surface, and is made of glass having transparency. This substrate 2 has a thickness of about 1 mm to about 5 mm. The substrate electrodes 3a and 3b isolated from each other by grooves 3c are formed on an upper surface of the substrate 2. The substrate electrodes 3a and 3b, each having a thickness of about 800 nm, are made of TCO (transparent conductive oxide) such as tin oxide ($SnO_2$) having conductivity and translucency. Each of the substrate electrodes 3a and 3b are examples of the "first substrate electrode" and the "second substrate electrode" in the present invention respectively, and each groove 3c is an example of the "first groove" in the present invention.

The photoelectric conversion units 4 made of p-i-n amorphous silicon semiconductors are formed on upper surfaces of the substrate electrodes 3a and 3b. Each photoelectric conversion unit 4 made of the p-i-n amorphous silicon semiconductors is constituted by a p-type hydrogenated amorphous silicon carbide (a-SiC:H) layer having a thickness of about 10 nm to about 20 nm, an i-type hydrogenated amorphous silicon (a-Si:H) layer having a thickness of about 250 nm to about 350 nm and an n-type hydrogenated amorphous silicon layer having a thickness of about 20 nm to about 30 nm. The photoelectric conversion units 4 are formed on the upper surfaces of the substrate electrodes 3a to have grooves 4a, 4b and 4c and fill up the grooves 3c. The photoelectric conversion units 4 made of the amorphous silicon semiconductors are formed for absorbing light of a relatively short wavelength. Each photoelectric conversion unit 4 is an example of the "first photoelectric conversion layer" in the present invention.

The intermediate layers 5 having grooves 5a, 5b and 5c on regions corresponding to the regions 4a, 4b and 4c respectively are formed on upper surfaces of the photoelectric conversion units 4. Each intermediate layer 5 has a thickness of about 10 nm to about 500 nm. The intermediate layers 5 are made of TCO such as zinc oxide (ZnO) having conductivity with a function of partly reflecting and partly transmitting light incident from the side of the substrate 2. Each intermediate layer 5 also has a function of increasing the quantity of light passing through the photoelectric conversion unit 4 by partly reflecting the light incident from the side of the substrate 2. Therefore, an output current of each photoelectric conversion unit 4 can be increased without increasing the thickness thereof. In other words, the output current of each photoelectric conversion unit 4 can be increased while suppressing photo-deterioration remarkably increased in response to the thickness of each photoelectric conversion unit 4 made of the amorphous silicon semiconductor. Thus, the output currents of the photoelectric conversion units 4 and 6 can be balanced.

The photoelectric conversion units 6 made of p-i-n microcrystalline silicon semiconductors having grooves 6a, 6b and 6c on regions corresponding to the grooves 5a, 5b and 5c respectively are formed on upper surfaces of the intermediate layers 5. Each photoelectric conversion unit 6 made of the p-i-n microcrystalline silicon semiconductor is constituted by a p-type hydrogenated microcrystalline silicon (μm-Si:H) layer having a thickness of about 10 nm to about 20 nm, an i-type hydrogenated microcrystalline silicon layer having a thickness of about 1500 nm to about 2000 nm and an n-type hydrogenated microcrystalline silicon layer having a thickness of about 20 nm to about 30 nm. The photoelectric conversion units 6 made of the p-i-n microcrystalline silicon semiconductors are formed for absorbing light of a relatively long wavelength. Each photoelectric conversion unit 6 is an example of the "second photoelectric conversion portion" in the present invention.

The translucent conductive layers 7 having grooves 7a, 7b and 7c on regions corresponding to the grooves 6a, 6b and 6c respectively are formed on upper surfaces of the photoelectric conversion units 6. Each translucent conductive layer 7 has a thickness of about 70 nm and is mainly made of TCO such as indium oxide layer ($InO_2$).

According to the first embodiment, the insulating members 8 having grooves 8a and 8b on regions corresponding to the grooves 7a and 7b respectively are so formed on a part of upper surfaces of the translucent conductive layers 7 as to extend along the upper surfaces of the translucent conductive layers 7. First ends 8c of the insulating members 8 are so formed as to extend from grooves 10a above the grooves 3c. More specifically, each first end 8c of the insulating member 8 extends up to a position corresponding to a side surface 3d located on a side farther from the groove 10a among two surface of the groove 3c. Second ends 8d of the insulating members 8 extend up to regions opposite to the grooves 3c with respect to grooves 10c for isolating back electrodes 9 described later. The insulating members 8 are so formed as to fill up the grooves 10a constituted by the grooves 4c, 5c, 6c and 7c. In other words, the insulating members 8 are so embedded that portions located on sides of the grooves 3c with respect to the grooves 5c of the intermediate layers 5 and portions located on sides opposite to the grooves 3c with respect to the grooves 5c of the intermediate layers 5 are electrically insulated from each other. Thus, in the grooves 10a, cut surfaces of the photoelectric conversion units 4, the intermediate layers 5, the photoelectric conversion units 6 and the translucent conductive layers 7 are so formed as to be covered with the insulating members 8. The insulating members 8 are made of oxide silicon ($SiO_2$). Each insulating member 8 is an example of the "insulating member" in the present invention.

The back electrodes 9a and 9b isolated by grooves 9c formed on regions corresponding to the grooves 8b are formed on the overall upper surfaces of the insulating members 8 and the overall upper surfaces formed with no insulating members 8 of the translucent conductive layers 7. The back electrodes 9a and 9b are formed on surfaces of the insulating members 8 on regions adjacent to the grooves 10c. The back electrodes 9b are so formed as to fill up grooves 10b. Thus, the back electrode 9b and the substrate electrode 3a are electrically connected to each other. The back electrodes 9b are connected to the translucent conductive layers 7 corresponding to the substrate electrodes 3b on regions opposite to the grooves 10a with respect to the grooves 3c so as to extend over the insulating members 8. Thus, the substrate electrodes 3a and the translucent conductive layers 7 corresponding to the substrate electrodes 3b are electrically connected to each other through the back electrodes 9b so that a plurality of units are serially connected to each other in the direction along the main surface of the substrate 2. The back electrodes 9a and 9b each have a thickness of about 200 nm to about 400 nm and are made of a metal material mainly composed of silver (Ag). The back electrodes 9a and 9b each have a function of reflecting light incident from a lower surface of the substrate 2 and reaching the back electrodes 9a and 9b to thereby introduce the reflected light in the photoelectric conversion units 4 and 6 again. Each of the back electrodes 9a and 9b are examples of the "first back electrode" and the "second back electrode" in the present invention respectively.

The grooves 10c for electrically isolating the back electrodes 9a from the back electrodes 9b are formed by the grooves 4b, 5b, 6b, 7b, 8b and 9c, and the grooves 10a for electrically isolating the intermediate layers 5 are formed by the grooves 4c, 5c, 6c and 7c. The grooves 10b for electrically connecting the back electrodes 9b and the substrate electrodes 3a are formed by the grooves 4a, 5a, 6a, 7a and 8a. Each of the grooves 10a, 10b and 10c are example of the "second groove", the "third groove" and the "fourth groove" in the present invention respectively.

A process of manufacturing the photovoltaic apparatus 1 according to the first embodiment will be now described with reference to FIGS. 1 to 9.

Figure 2:
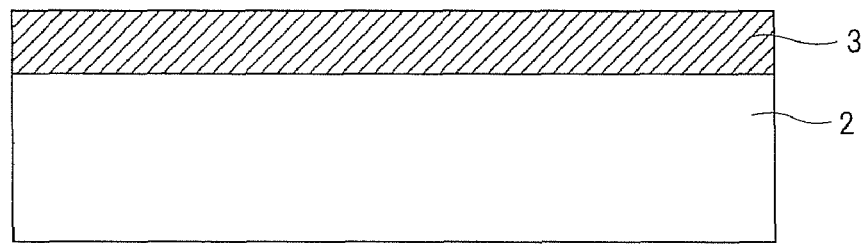
FIGS. 2 to 9 are sectional views for illustrating a process of manufacturing the photovoltaic apparatus according to the first embodiment shown in FIG. 1.

As shown in FIG. 2, a substrate electrode 3 made of tin oxide having a thickness of about 800 nm is formed on an insulating upper surface of the substrate 2 by thermal CVD (chemical vapor deposition).

Figure 3:
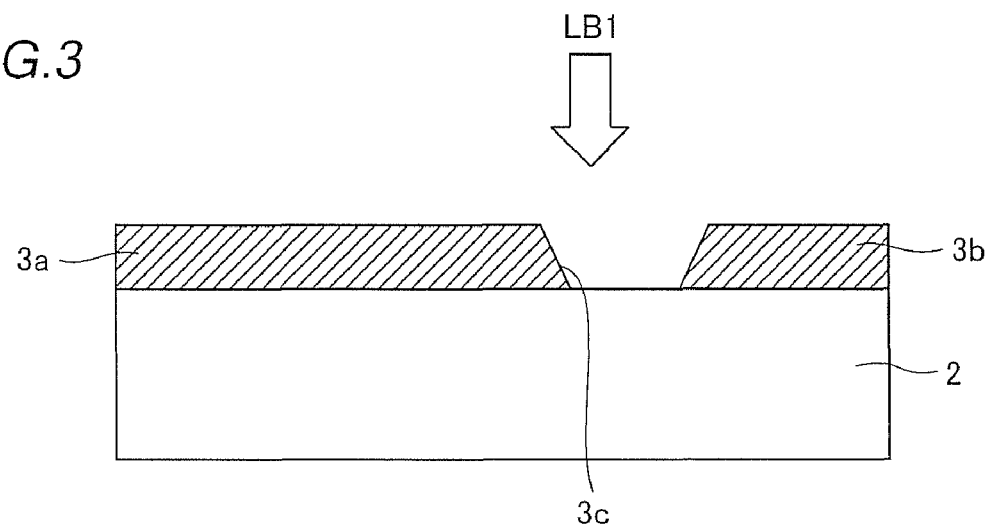

As shown in FIG. 3, the grooves 3c each having a width of about 50 μm are formed at intervals of about 9.0 mm by scanning the substrate electrode 3 with a fundamental wave (LB1 in FIG. 3) of an Nd:YAG laser having a wavelength of about 1064 nm, an oscillation frequency of about 20 kHz and average power of about 14.0 W from above. Thus, the substrate electrode 3 is separated into the substrate electrodes 3a and 3b through the grooves 3c.

Figure 4:
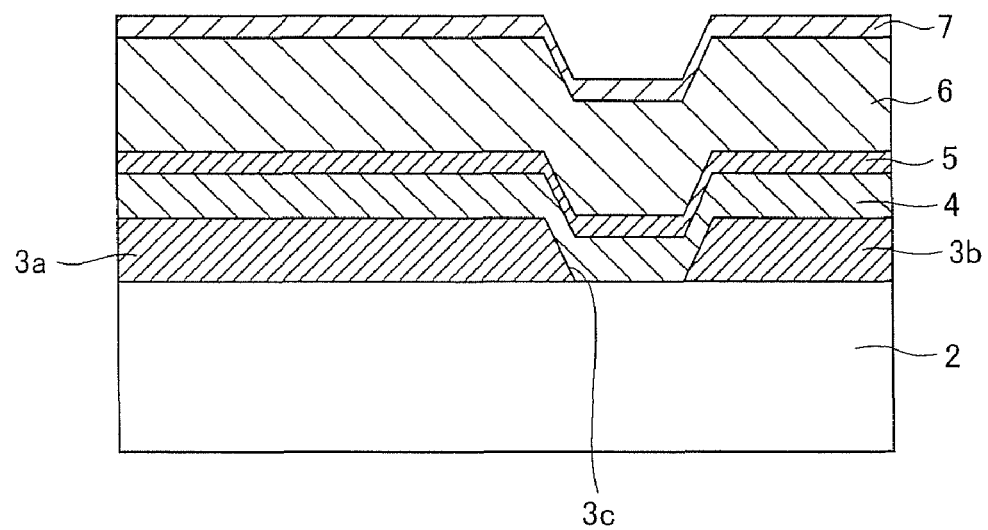

As shown in FIG. 4, the photoelectric conversion unit 4 made of the amorphous silicon semiconductor is formed by successively forming the p-type hydrogenated amorphous silicon carbide layer having a thickness of about 10 nm to about 20 nm, the i-type hydrogenated amorphous silicon layer having a thickness of about 250 nm to about 350 nm and the n-type hydrogenated amorphous silicon layer having a thickness of about 20 nm to about 30 nm on the upper surfaces of the substrate electrodes 3a and 3b by plasma CVD. Thereafter the intermediate layer 5 of zinc oxide having a thickness of about 10 nm to about 500 nm is formed on the upper surface of the photoelectric conversion unit 4 by sputtering. Then, the photoelectric conversion unit 6 made of the microcrystalline silicon semiconductor is formed by successively forming the p-type hydrogenated microcrystalline silicon layer having a thickness of about 10 nm to about 20 nm, the i-type hydrogenated microcrystalline silicon layer having a thickness of about 1500 nm to about 2000 nm and the n-type hydrogenated microcrystalline silicon layer having a thickness of about 20 nm to about 30 nm on the upper surface of the intermediate layer 5 by plasma CVD. The translucent conductive layer 7 having a thickness of about 70 nm, mainly composed of indium oxide is formed by sputtering.

According to the first embodiment, the photoelectric conversion unit 4, the intermediate layer 5, the photoelectric conversion unit 6 and the back electrode 7 are so continuously formed that the surfaces of the photoelectric conversion unit 4, the intermediate layer 5 and the photoelectric conversion unit 6 are not exposed to the atmosphere.

Figure 5:
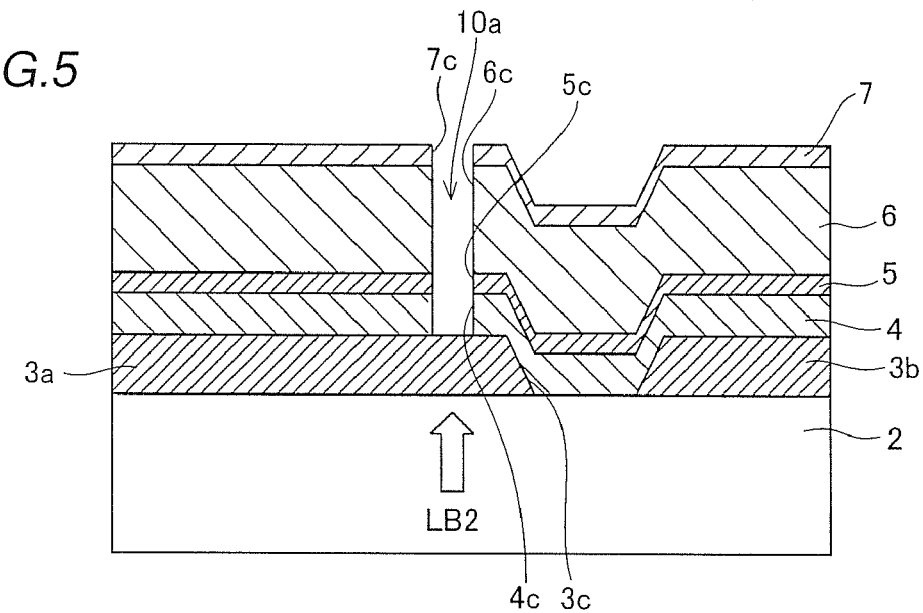

As shown in FIG. 5, the photoelectric conversion unit 4, the intermediate layer 5, the photoelectric conversion unit 6 and the translucent conductive layer 7 are cut by scanning the photoelectric conversion unit 4, the intermediate layer 5, the photoelectric conversion unit 6 and the translucent conductive layer 7 with second harmonics (LB2 in FIG. 5) of an Nd:YAG laser having a wavelength of about 532 nm, an oscillation frequency of about 12 kHz and average power of about 230 mW from the side of the substrate 2, so as to be adjacent to the grooves 3c. Thus, the grooves 10a each having a width of about 50 μm, constituted by the grooves 4c, 5c, 6c and 7c are formed.

Figure 6:
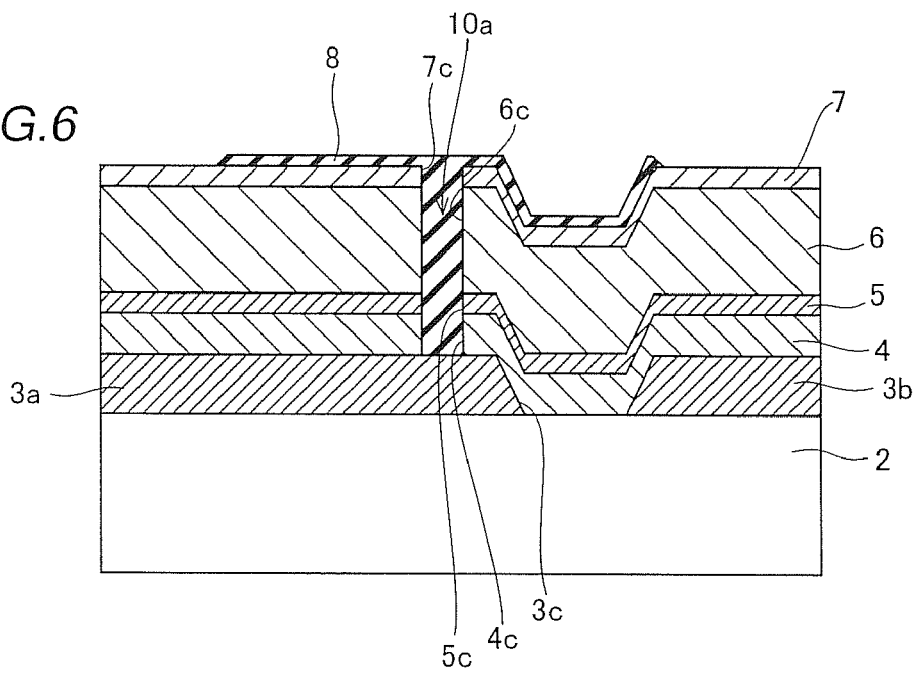

As shown in FIG. 6, per hydor poly silazane is applied by screen printing by employing a contact mask (not shown) made of stainless steel having linear openings (not shown) of about 400 μm, thereby having a width of about 400 μm to about 500 μm on either side of the grooves 10a. Thus, the insulating members 8 are so formed as to fill up the grooves 10a made of oxide silicon and extend along the surfaces of the translucent conductive layers 7. The insulating members 8 fill up the grooves 10a, whereby the intermediate layers 5 cut by the grooves 10a are electrically isolated.

Figure 7:
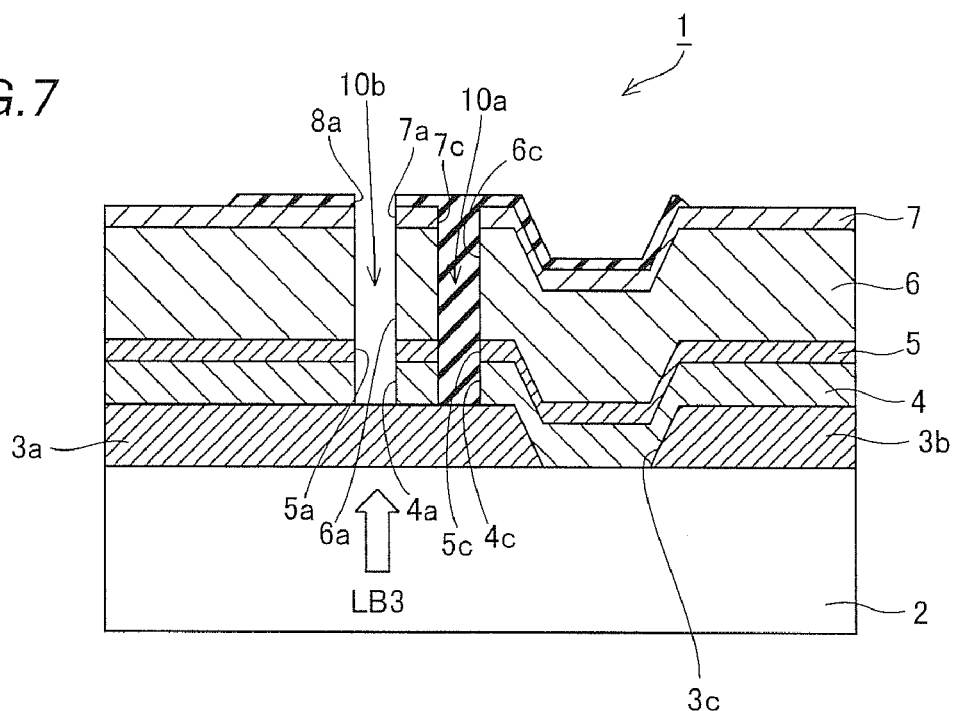

As shown in FIG. 7, the grooves 10b each having a width of about 50 μm, constituted by the grooves 4a, 5a, 6a, 7a and 8a are formed by scanning the regions opposite to the grooves 3c with respect to the grooves 10a with a laser (LB3 in FIG. 3) similar to the aforementioned LB2 from the side of the substrate 2.

Figure 8:
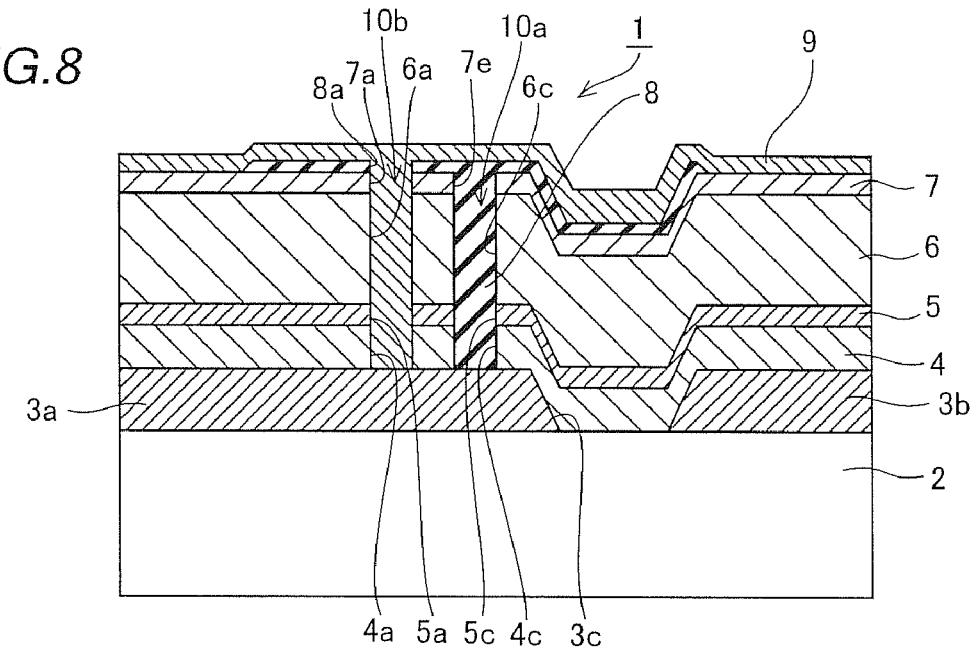
Figure 9:
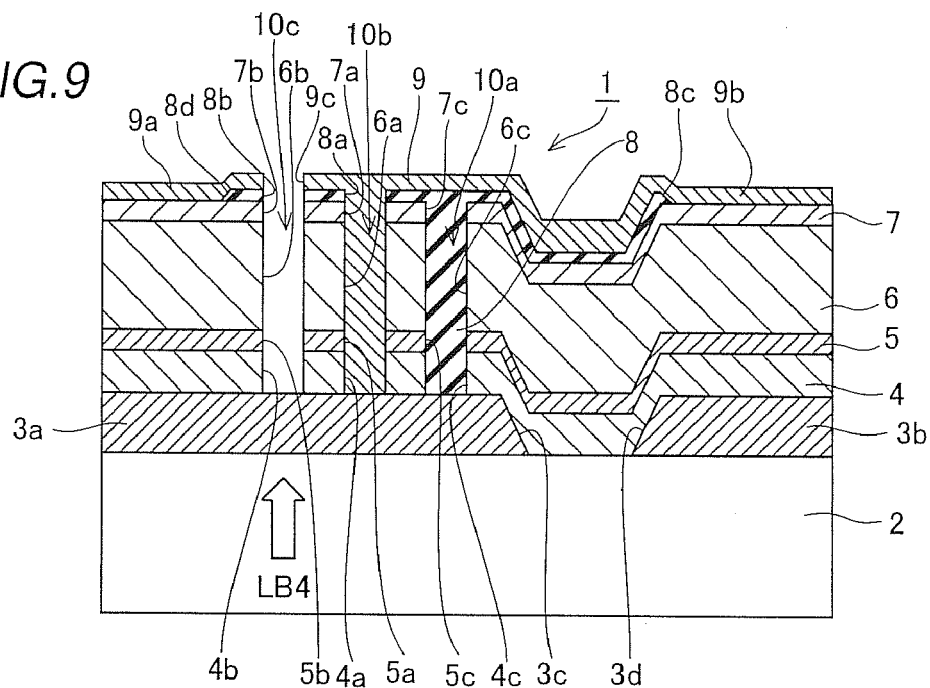

Thereafter the back electrodes 9 mainly composed of silver are formed by sputtering, to fill up the grooves 10b and cover the translucent conductive layers 7 and the insulating members 8, as shown in FIG. 8. Thus, the substrate electrodes 3a and the translucent conductive layers 7 on the sides of the substrate electrodes 3b are electrically connected to each other. As shown in FIG. 9, the photoelectric conversion units 4, the intermediate layers 5, the photoelectric conversion units 6, the translucent conductive layers 7, the insulating members 8 and the back electrodes 9 are cut by scanning the regions opposite to the grooves 3c with respect to the grooves 10a with a laser (LB4 in FIG. 9) similar to the aforementioned LB2 from the side of the substrate 2. The grooves 10c each having a width of about 50 μm, constituted by the grooves 4b, 5b, 6b, 7b, 8b and 9c are formed. Thus the back electrode 9 is separated into the back electrodes 9a and the back electrodes 9b, thereby forming the photovoltaic apparatus 1 shown in FIG. 1.

According to the first embodiment, as hereinabove described, the insulating members 8 are so formed as to extend up to the regions opposite to the grooves 3c with respect to the grooves 10c, whereby the insulating members 8 are formed on the wide regions as compared with the case where the insulating members 8 are formed only on the grooves 10a and in the vicinity of the grooves 10a and hence a mask with high dimensional accuracy may not be employed when forming the insulating members 8.

According to the first embodiment, as hereinabove described, the insulating members 8 are so formed as to extend up to the regions opposite to the grooves 3c with respect to the grooves 10c and the back electrodes 9a and the back electrodes 9 are formed on the insulating members 8 in the regions including the grooves 10c, whereby intervals between the back electrodes 9a and 9b and the substrate electrodes 3a or the intermediate layers 5 can be increased by the thicknesses of the insulating members 8. Thus, the back electrodes 9 molten by the laser LB4 when forming the grooves 10c by applying the laser LB4 (see FIG. 9) can be inhibited from adhering to the substrate electrodes 3a exposed by forming the grooves 5b of the intermediate layers 5 on the grooves 10c or the grooves 10c. Consequently, the back electrodes 9a or 9b and the intermediate layers 5 or the substrate electrodes 3a can be inhibited from an electric short circuit.

According to the first embodiment, as hereinabove described, the back electrodes 9 are formed through the translucent conductive layers 7 formed on the surfaces of the photoelectric conversion layers 6, whereby the translucent conductive layers 7 can inhibit silver contained in the back electrodes 9 from diffusing into the photoelectric conversion layers 6. Thus, it is possible to suppress reduction in reflectivity of the back electrodes 9a and 9b caused by alloying of silver and silicon contained in the photoelectric conversion layers 6. Therefore, characteristics of the photovoltaic apparatus 1 can be inhibited from reduction.

According to the first embodiment, as hereinabove described, the insulating members 8 are so formed as to extend from the grooves 10a up to the regions above the grooves 3c, whereby the insulating members 8 can be formed on the further wider regions and hence a mask with high dimensional accuracy may not be employed when forming the insulating members 8.

According to the first embodiment, as hereinabove described, the grooves 10a can be patterned after forming the translucent conductive layer 7 after forming the photoelectric conversion layer 6, and hence the surfaces of the photoelectric conversion layers 6, to be most inhibited from contamination in the process of manufacturing the photovoltaic apparatus 1, can be prevented from exposure to the atmosphere.

Second Embodiment

Figure 10:
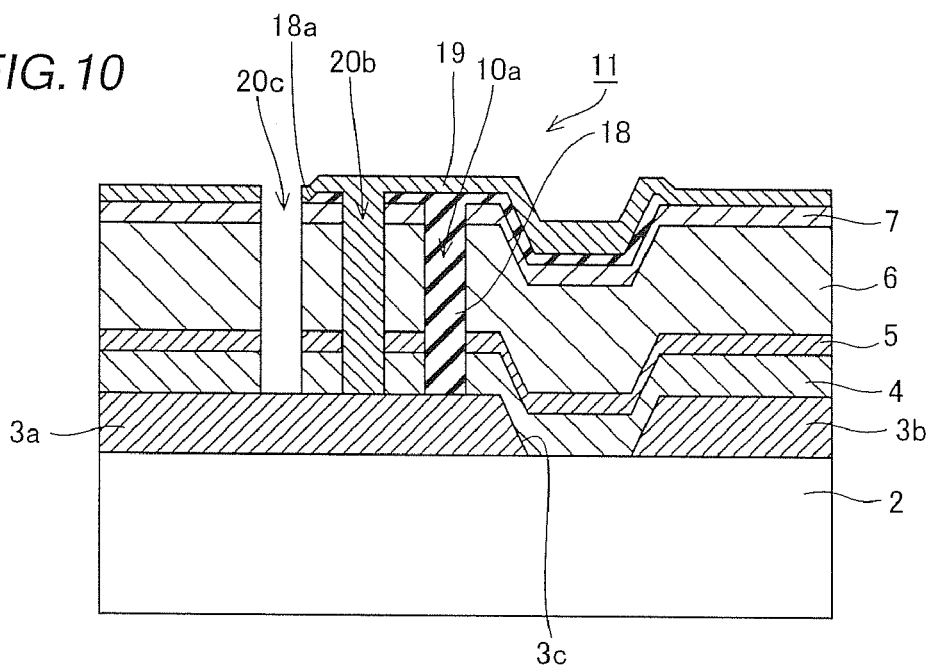
FIG. 10 is a sectional view showing a structure of a photovoltaic apparatus according to a second embodiment of the present invention.

Referring to FIG. 10, insulating members 18 are so formed as to extend up to regions between grooves 20c corresponding to the grooves 10c and grooves 20b corresponding to the grooves 10b in a second embodiment, dissimilarly to the aforementioned first embodiment.

In a photovoltaic apparatus 11 according to the second embodiment, ends 18a of the insulating members 18 do not extend up to the grooves 20c, whereby back electrodes 19 are formed on regions in the vicinity of the grooves 20c corresponding to the grooves 10c of the aforementioned first embodiment on surfaces of the translucent conductive layers 7 without insulating members 18. A process of manufacturing the photovoltaic apparatus 11 is similar to that of the aforementioned first embodiment except that the ranges where the insulating members 18 extend are reduced as compared with the aforementioned first embodiment and the grooves 20c are formed outside the regions where the insulating members 18 are formed, and hence the detained description thereof is not repeated.

According to the second embodiment, as hereinabove described, the insulating members 18 are so formed as to extend up to the regions between the grooves 20c and the grooves 20b, whereby the insulating members 18 are formed on the wide regions as compared with the case of forming the insulating members 18 only on the grooves 10a and the regions in the vicinity of the grooves 10a, and hence a mask with high dimensional accuracy may not be employed when forming the insulating members 18.

According to the second embodiment, as hereinabove described, the insulating members 18 may not be patterned when forming the grooves 20c dissimilarly to the case of the aforementioned first embodiment where the grooves 10c are formed, and hence the intensity of a laser required for forming the grooves 20c can be reduced. Thus, damage of the photovoltaic apparatus 11 due to heat of the laser in forming the grooves 20c can be reduced.

A comparative experiment conducted in order to confirm the effects of the aforementioned embodiments will be now described. In this comparative experiment, photovoltaic apparatuses according to Example 1, Example 2 and comparative example 1 were prepared as follows:

The photovoltaic apparatus 1 according to Example 1 was prepared through the manufacturing process of the aforementioned first embodiment, as shown in FIG. 1. The photovoltaic apparatus 11 according to the Example 2 was prepared through the manufacturing process of the aforementioned second embodiment, as shown in FIG. 10.

Figure 11:
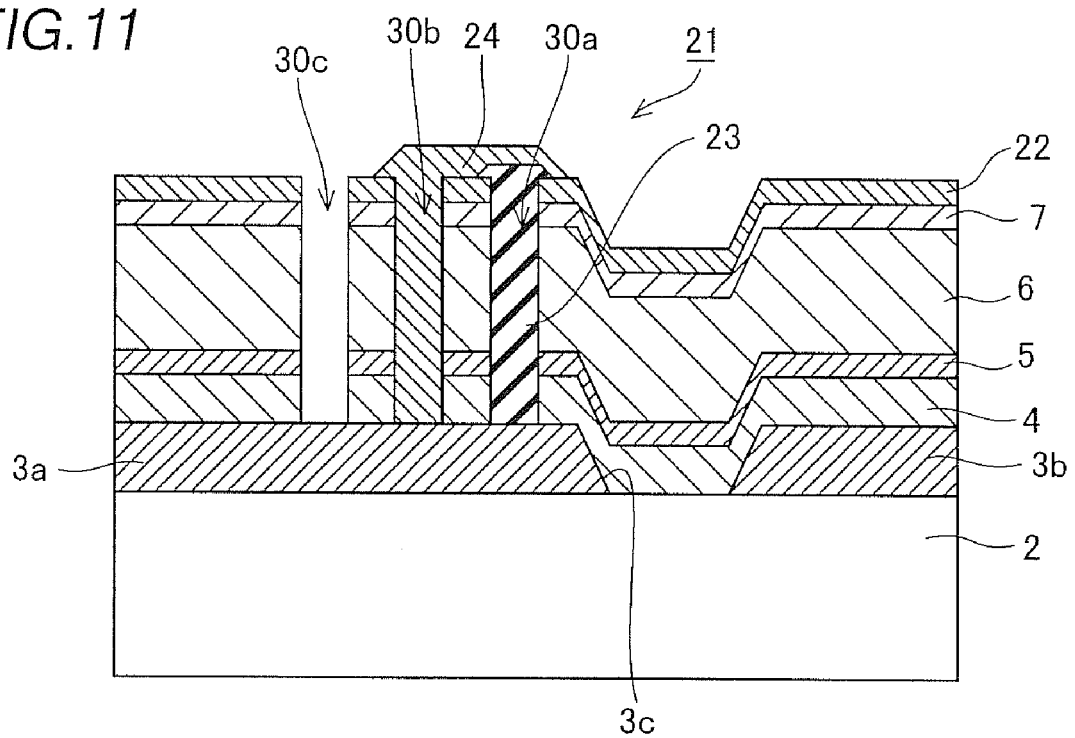
FIG. 11 is a sectional view showing a structure of a photovoltaic apparatus according to a comparative example of a comparative experiment.

The photovoltaic apparatus 21 according to comparative example 1 was prepared so as to have a structure as shown in FIG. 11. As a manufacturing process for the photovoltaic apparatus 21 according to comparative example 1, a photoelectric conversion unit 4, an intermediate layer 5, a photoelectric conversion unit 6, a translucent conductive layer 7 and a back electrode 22 were formed after forming substrate electrodes 3a and 3b on a substrate 2. Thereafter grooves 30a, 30b and 30c were so formed as to pass through the photoelectric conversion unit 4, the intermediate layer 5, the photoelectric conversion unit 6, the translucent conductive layer 7 and the back electrode 22. Insulating members 23 filled up only the grooves 30a by employing a contact mask (not shown) with high dimensional accuracy. Conductive members 24 made of silver paste were connected to the back electrodes 22 on the sides of the substrate electrodes 3b, to fill up the grooves 30b and extend over the insulating members 23. Also in this structure, the back electrodes 22 and the intermediate layers 5 are electrically isolated from each other through the insulating members 23 and hence the back electrodes 22 and the intermediate layers 5 can be inhibited from an electric short circuit. Therefore, the photovoltaic apparatus 21 according to comparative example 1 requires a mask with relatively high dimensional accuracy when forming the insulating members 23 while having a structure solving the problem of the present invention.

As to the photovoltaic apparatus 1 according to the aforementioned Example 1, the photovoltaic apparatus 11 according to the aforementioned Example 2 and the photovoltaic apparatus 21 according to the comparative example 1, open circuit voltages (Voc), short circuit currents (Isc), fill factors (F.F.) and maximum power levels (Pmax) were measured and results of the measurements were normalized with those of the photovoltaic apparatus 21 according to comparative example 1.

TABLE 1

|  | Voc (V) | Isc (A) | F.F | Pmax (W) |
|---|---|---|---|---|
| Example 1 | 1.0000 | 1.0000 | 1.0104 | 1.0078 |
| Example 2 | 1.0000 | 0.9912 | 0.9949 | 0.9948 |
| comparative example 1 | 1.0000 | 1.0000 | 1.0000 | 1.0000 |

Referring to the aforementioned Table 1, both of the open circuit voltages of Example 1 and Example 2 were "1.0000". The short circuit currents of Example 1 and Example 2 were "1.0000" and "0.9912" respectively. The fill factors of Example 1 and Example 2 were "1.0104" and "0.9949" respectively. The maximum power levels of Example 1 and Example 2 were "1.0078" and "0.9948" respectively. In other words, it has been proved as characteristics of Example 1 that Example 1 has higher values as a whole as compared with comparative example 1 and Example 2.

The aforementioned results are conceivably because of the following reason. In other words, the back electrodes 9a and 9b are formed on the regions including the grooves 10c through the insulating members 8 in Example 1 shown in FIG. 1, and hence the distances between the back electrodes 9a and 9b and the intermediate layers 5 or the substrate electrodes 3a are larger than those of Example 2 and comparative example 1. Therefore, probability of adherence of the back electrodes 9 molten by heat of a laser to the intermediate layers 5 or the substrate electrodes 3a when forming the grooves 10c of the photovoltaic apparatus 1 by laser patterning is reduced as compared with the case where the grooves 20c of the photovoltaic apparatus 11 and the grooves 30c of the photovoltaic apparatus 21 are formed. Consequently, the back electrodes 9 and the intermediate layers 5 or the substrate electrodes 3a can be inhibited from an electric short circuit and hence characteristics are conceivably improved in Example 1 as compared with Example 2 and comparative example 1.

Although the present invention has been described and illustrated in detail, it is clearly understood that the same is by way of illustration and example only and is not to be taken by way of limitation, the spirit and scope of the present invention being limited only by the terms of the appended claims.

While zinc oxide (ZnO) is employed as the intermediate layers 5 in each of the aforementioned embodiments and Examples, the present invention is not restricted to this but a sintered material employing a zinc oxide compound containing magnesium, tin oxide or an organic substance as a bonding material may be alternatively employed.

While the insulating members 8 are so formed as to extend up to the positions corresponding to the sides surfaces 3d of the grooves 3c in each of the aforementioned embodiments and Examples, the present invention is not restricted to this but the insulating members 8 may be extend up to any regions so far as the regions are located from the grooves 10a up to the side surfaces 3d of the grooves 3c.

What is claimed is:

1. A photovoltaic apparatus comprising:
a substrate having an insulating surface;
a first substrate electrode and a second substrate electrode formed on said insulating surface of said substrate and separated through a first groove;
a first photoelectric conversion layer so formed as to cover said first substrate electrode and said second substrate electrode;
a second photoelectric conversion layer formed on a surface of said first photoelectric conversion layer through a conductive intermediate layer;
a second groove so formed as to cut at least said intermediate layer on a region of said first substrate electrode;
an insulating member so formed as to cover at least a cut portion of said intermediate layer in said second groove and extend along an upper surface of said second photoelectric conversion layer;
a third groove so formed as to pass through said first photoelectric conversion layer, said intermediate layer, said second photoelectric conversion layer and said insulating member on a region opposite to said first groove with respect to said second groove and expose a surface of said first substrate electrode;
a back electrode so formed as to electrically connecting said first substrate electrode and said second photoelectric conversion layer on a side of said second substrate electrode through said third groove; and
a fourth groove for electrically separating at least said back electrode into a first back electrode and a second back electrode corresponding to said first substrate electrode and said second substrate electrode respectively on a region opposite to said first groove with respect to said third groove, wherein
said insulating member is so formed as to extend up to at least said region opposite to said first groove with respect to said third groove,
said insulating member is so formed as to cover at least cut surfaces of said first photoelectric conversion layer, said intermediate layer and said second photoelectric conversion layer in said second groove,
said second groove is so formed as to cut said first photoelectric conversion layer, said intermediate layer and said second photoelectric conversion layer; and
said second groove is so formed as to expose a surface of said first substrate electrode.

2. The photovoltaic apparatus according to claim 1, wherein
said insulating member is so formed as to extend up to a region opposite to said first groove with respect to said fourth groove, and
said first back electrode and said second back electrode are formed on regions adjacent to said fourth groove of said insulating member.

3. The photovoltaic apparatus according to claim 1, wherein
said insulating member is so formed as to extend up to a region between said third groove and said fourth groove.

4. The photovoltaic apparatus according to claim 1, wherein
said back electrode is formed on a surface of said second photoelectric conversion layer through a translucent conductive layer.

5. The photovoltaic apparatus according to claim 1, wherein
said insulating member is so formed as to extend from said second groove up to a region above said first groove.

6. The photovoltaic apparatus according to claim 5, wherein
said back electrode is so formed on a surface of said second photoelectric conversion layer through a translucent conductive layer as to be in contact with said translucent conductive layer on a region opposite to said second groove with respect to said first groove.

7. The photovoltaic apparatus according to claim 1, wherein said first photoelectric conversion layer has a function of absorbing light having a wavelength different from said second photoelectric conversion layer.

8. The photovoltaic apparatus according to claim 1, wherein
said intermediate layer has a function of partially reflecting and transmitting light incident from a side of said substrate.

9. The photovoltaic apparatus according to claim 1, wherein
said second back electrode is electrically connected to said first substrate electrode by filling up said third groove.

10. The photovoltaic apparatus according to claim 1, wherein
said fourth groove is so formed as to cut at least said first photoelectric conversion layer, said intermediate layer, said second photoelectric conversion layer and said back electrode.

11. The photovoltaic apparatus according to claim 1, wherein said second groove is so formed as not to cut said back electrode.

* * * * *